US011309850B2

(12) United States Patent
Noto et al.

(10) Patent No.: US 11,309,850 B2
(45) Date of Patent: Apr. 19, 2022

(54) CARTESIAN FEEDBACK CIRCUIT

(71) Applicant: Mitsubishi Electric Corporation, Tokyo (JP)

(72) Inventors: Hifumi Noto, Tokyo (JP); Hiroyuki Akutsu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 76 days.

(21) Appl. No.: 16/851,284

(22) Filed: Apr. 17, 2020

(65) Prior Publication Data
US 2020/0244231 A1 Jul. 30, 2020

Related U.S. Application Data

(63) Continuation of application No. PCT/JP2017/043274, filed on Dec. 1, 2017.

(51) Int. Cl.
*H03F 1/38* (2006.01)
*H03F 1/34* (2006.01)
*H03F 3/19* (2006.01)
*H04L 27/36* (2006.01)

(52) U.S. Cl.
CPC ............... *H03F 1/34* (2013.01); *H03F 1/38* (2013.01); *H03F 3/19* (2013.01); *H04L 27/36* (2013.01); *H03F 2200/336* (2013.01); *H03F 2200/451* (2013.01); *H03F 2201/32* (2013.01)

(58) Field of Classification Search
CPC ........ H03F 1/34; H03F 3/19; H03F 2200/336; H03F 2200/451; H03F 2201/32; H03F 3/189; H04L 27/36; H04L 27/3809; H04B 1/04; H04B 3/04
USPC .................................. 330/10, 149, 296, 297
See application file for complete search history.

(56) References Cited

U.S. PATENT DOCUMENTS

| 6,549,067 | B1 | 4/2003 | Kenington |
| 8,326,238 | B2 * | 12/2012 | Yang ........................ H03F 3/189 |
| | | | 455/114.3 |
| 2002/0016154 | A1 | 2/2002 | Huttunen |

FOREIGN PATENT DOCUMENTS

| JP | 8-204774 A | 8/1996 |
| JP | 2000-244370 A | 9/2000 |
| JP | 2001-60883 A | 3/2001 |
| JP | 2002-533022 A | 10/2002 |
| JP | 2002-541703 A | 12/2002 |

* cited by examiner

*Primary Examiner* — Khanh V Nguyen
*Assistant Examiner* — Khiem D Nguyen
(74) *Attorney, Agent, or Firm* — Birch, Stewart, Kolasch & Birch, LLP

(57) ABSTRACT

It is configured to output a first I signal having passed through a first inverse characteristic circuit having inverse frequency characteristics to frequency characteristics of a first loop filter circuit, to the first loop filter circuit, and output a first Q signal having passed through a second inverse characteristic circuit having inverse frequency characteristics to frequency characteristics of a second loop filter circuit, to the second loop filter circuit.

10 Claims, 8 Drawing Sheets

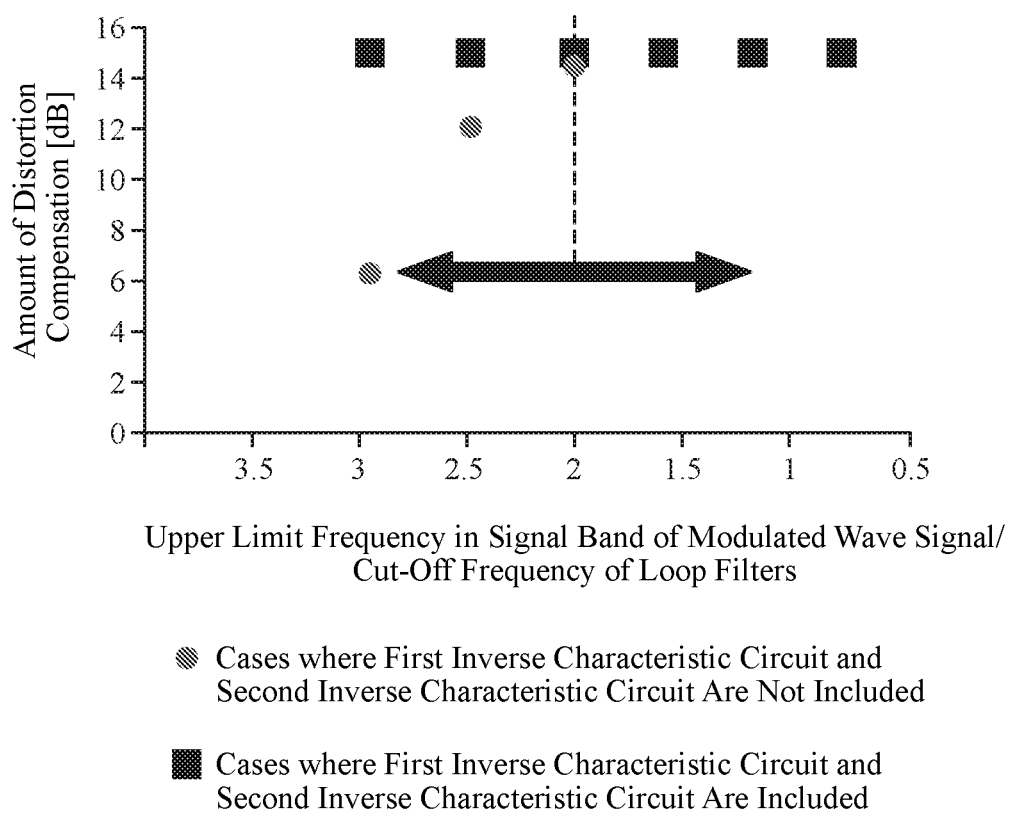

CARTESIAN FEEDBACK CIRCUIT

CROSS REFERENCE TO RELATED APPLICATIONS

This application is a Continuation of PCT International Application No. PCT/JP2017/043274 filed on Dec. 1, 2017, which is hereby expressly incorporated by reference into the present application.

TECHNICAL FIELD

The invention relates to a Cartesian feedback circuit including loop filters that limit signal bands.

BACKGROUND ART

An amplifier used for communication generally has non-linearity that causes a distortion in a signal waveform upon amplifying a signal. Communication requires linear signal transmission, and thus, a distortion compensating circuit that compensates for distortions occurring in the amplifier is used.

Distortion compensating circuits are classified into a negative-feedback type distortion compensating circuit, a feedforward type distortion compensating circuit, and a predistortion type distortion compensating circuit.

For example, the following Patent Literature 1 discloses a Cartesian feedback circuit which is a specific circuit of a negative-feedback type distortion compensating circuit. The Cartesian feedback circuit disclosed in Patent Literature 1 includes subtractors and band limiting circuits. Each subtractor subtracts a feedback baseband signal obtained by branching a part of a quadrature-modulated signal outputted from a non-linear amplifier, from an input baseband signal, and thereby obtains a subtracted baseband signal. In addition, each band limiting circuit limits the band of the subtracted baseband signal. The subtractor and the band limiting circuit form a so-called loop filter.

CITATION LIST

Patent Literatures

Patent Literature 1: JP H08-204774 A

SUMMARY OF INVENTION

Technical Problem

The Cartesian feedback circuit is a negative-feedback type distortion compensating circuit, and thus, when the Cartesian feedback circuit is applied to an amplifier that amplifies wide-band modulated wave signals, the Cartesian feedback circuit needs to have a loop gain over the entire band. However, when the Cartesian feedback circuit is configured to have a loop gain over the entire wide band, positive feedback is applied at a given frequency, causing oscillation, and distortions occurring in the amplifier may not be able to be compensated for. On the other hand, when the loop gain of the Cartesian feedback circuit is set to a value in a range in which positive feedback is not applied over the entire wide band, only a smaller amount of distortion compensation than a desired amount of distortion compensation can be obtained, and distortions occurring in the amplifier cannot be sufficiently compensated for.

Hence, when a conventional Cartesian feedback circuit increases the loop gain to obtain a desired amount of distortion compensation, there is a need to limit bands using loop filters. However, when the conventional Cartesian feedback circuit limits the bands using loop filters, due to the influence of frequency characteristics of the loop filters, the gain drops and the phase is delayed near the cut-off frequency of the filters, causing a problem that the amount of distortion compensation becomes smaller than the loop gain.

The invention is made to solve a problem such as that described above, and an object of the invention is to obtain a Cartesian feedback circuit in which a change in gain and a change in phase caused by loop filters do not occur.

Solution to Problem

A Cartesian feedback circuit according to the invention includes: a first loop filter circuit to limit a signal band of a differential I signal, the differential I signal being a difference between a first I signal and a second I signal, the first I signal being an in-phase component of a modulated wave signal, the second I signal being an in-phase component of an amplified harmonic signal; a second loop filter circuit to limit a signal band of a differential Q signal, the differential Q signal being a difference between a first Q signal and a second Q signal, the first Q signal being a quadrature-phase component of the modulated wave signal, the second Q signal being a quadrature-phase component of the harmonic signal; a quadrature modulator to generate a harmonic signal from the signal-band-limited differential I signal and the signal-band-limited differential Q signal; an amplifier to amplify the harmonic signal generated by the quadrature modulator; a quadrature demodulator to demodulate each of the second I signal and the second Q signal from the harmonic signal amplified by the amplifier; a first inverse characteristic circuit having inverse frequency characteristics to frequency characteristics of the first loop filter circuit; and a second inverse characteristic circuit having inverse frequency characteristics to frequency characteristics of the second loop filter circuit, and the first I signal having passed through the first inverse characteristic circuit is outputted to the first loop filter circuit, and the first Q signal having passed through the second inverse characteristic circuit is outputted to the second loop filter circuit.

Advantageous Effects of Invention

According to the invention, it is configured to output a first I signal having passed through the first inverse characteristic circuit having inverse frequency characteristics to the frequency characteristics of the first loop filter circuit, to the first loop filter circuit, and output a first Q signal having passed through the second inverse characteristic circuit having inverse frequency characteristics to the frequency characteristics of the second loop filter circuit, to the second loop filter circuit, and thus, there is an advantageous effect of being able to obtain a Cartesian feedback circuit in which changes in gain and phase caused by loop filters do not occur.

BRIEF DESCRIPTION OF DRAWINGS

FIG. 3 is an illustrative diagram showing a relationship between a ratio of the cut-off frequency of a first loop filter circuit 4 and a second loop filter circuit 5 to the upper limit frequency in a signal band of a modulated wave signal, and the amount of distortion compensation.

DESCRIPTION OF EMBODIMENTS

To describe the invention in more detail, modes for carrying out the invention will be described below with reference to the accompanying drawings.

First Embodiment

Figure 1:
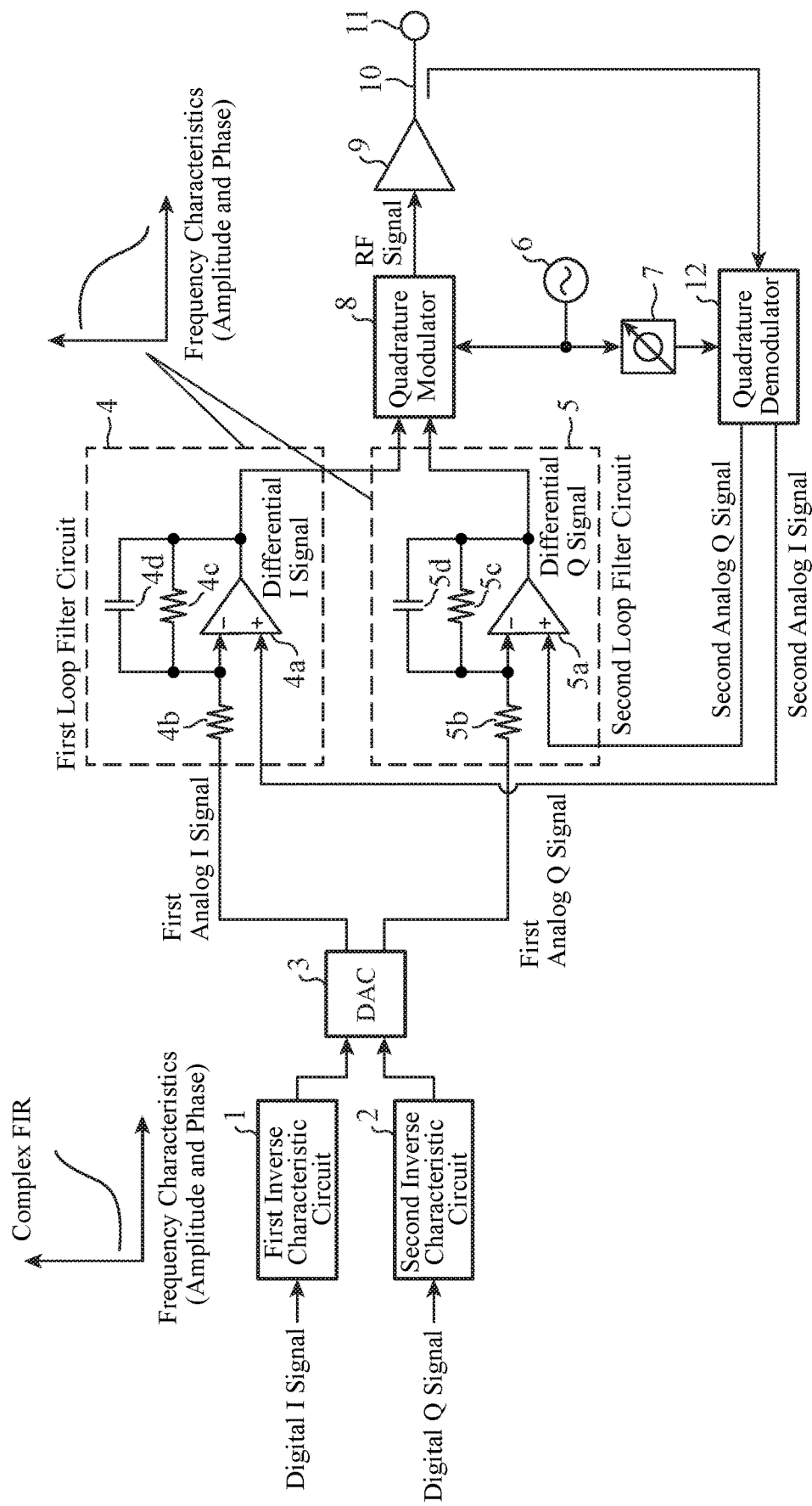
FIG. 1 is a configuration diagram showing a Cartesian feedback circuit of a first embodiment.

FIG. 1 is a configuration diagram showing a Cartesian feedback circuit of a first embodiment.

In FIG. 1, a first inverse characteristic circuit 1 is a digital filter that accepts, as input, a first I signal which is an in-phase component of a modulated wave signal. The first I signal is a digital signal and is hereinafter referred to as "digital I signal".

The first inverse characteristic circuit 1 has inverse frequency characteristics to the frequency characteristics of a first loop filter circuit 4, and uses a complex finite impulse response (FIR) filter, a complex infinite impulse response (IIR) filter, or the like, as a digital filter.

A second inverse characteristic circuit 2 is a digital filter that accepts, as input, a first Q signal which is a quadrature-phase component of the modulated wave signal. The first Q signal is a digital signal and is hereinafter referred to as "digital Q signal".

The second inverse characteristic circuit 2 has inverse frequency characteristics to the frequency characteristics of a second loop filter circuit 5, and uses a complex FIR filter, a complex IIR filter, or the like, as a digital filter.

A DAC 3 which is a digital-to-analog converter converts the digital I signal having passed through the first inverse characteristic circuit 1 into an analog signal (hereinafter, referred to as "first analog I signal"), and outputs the first analog I signal to the first loop filter circuit 4.

In addition, the DAC 3 converts the digital Q signal having passed through the second inverse characteristic circuit 2 into an analog signal (hereinafter, referred to as "first analog Q signal"), and outputs the first analog Q signal to the second loop filter circuit 5.

The first loop filter circuit 4 is a loop filter including an operational amplifier 4a, resistors 4b and 4c, and a capacitor 4d.

The first loop filter circuit 4 is a circuit that limits a signal band of a differential I signal which is a difference between the first analog I signal outputted from the DAC 3 and a second analog I signal outputted from a quadrature demodulator 12, and outputs the band-limited differential I signal to a quadrature modulator 8.

In the first embodiment, since the first inverse characteristic circuit 1 having inverse frequency characteristics to the frequency characteristics of the first loop filter circuit 4 is provided, even when the first loop filter circuit 4 causes a distortion in the differential I signal due to the frequency characteristics of the first loop filter circuit 4, the differential I signal outputted from the first loop filter circuit 4 does not have frequency characteristics, and has characteristics in which both amplitude and phase are flat.

The operational amplifier 4a is a differential amplifier that amplifies, when the first analog I signal outputted from the DAC 3 is inputted thereto through the resistor 4b, a differential I signal which is a difference between the inputted first analog I signal and a second analog I signal outputted from the quadrature demodulator 12.

The resistor 4b is connected at its one end to an output side of the DAC 3, and connected at its other end to an inverting input terminal (−) of the operational amplifier 4a.

The resistor 4c is connected at its one end to the inverting input terminal (−) of the operational amplifier 4a, and connected at its other end to an output terminal of the operational amplifier 4a.

The capacitor 4d is connected at its one end to the inverting input terminal (−) of the operational amplifier 4a, and connected at its other end to the output terminal of the operational amplifier 4a.

The signal band of the differential I signal amplified by the operational amplifier 4a is limited by the resistor 4c and the capacitor 4d.

The gain of the operational amplifier 4a is determined by $R_2/R_1$ which is a ratio of a resistance value $R_1$ of the resistor 4b to a resistance value $R_2$ of the resistor 4c, and the cut-off frequency of a loop filter which is the first loop filter circuit 4 is determined by the capacitance value of the capacitor 4d. The cut-off frequency decreases as the capacitance value of the capacitor 4d increases.

The second loop filter circuit 5 is a loop filter including an operational amplifier 5a, resistors 5b and 5c, and a capacitor 5d.

The second loop filter circuit 5 is a circuit that limits a signal band of a differential Q signal which is a difference between the first analog Q signal outputted from the DAC 3 and a second analog Q signal outputted from the quadrature demodulator 12, and outputs the band-limited differential Q signal to the quadrature modulator 8.

In the first embodiment, since the second inverse characteristic circuit 2 having inverse frequency characteristics to the frequency characteristics of the second loop filter circuit 5 is provided, even when the second loop filter circuit 5 causes a distortion in the differential Q signal due to the frequency characteristics of the second loop filter circuit 5, the differential Q signal outputted from the second loop filter circuit 5 does not have frequency characteristics, and have characteristics in which both amplitude and phase are flat.

The operational amplifier 5a is a differential amplifier that amplifies, when the first analog Q signal outputted from the DAC 3 is inputted thereto through the resistor 5b, a differential Q signal which is a difference between the inputted first analog Q signal and a second analog Q signal outputted from the quadrature demodulator 12.

The resistor 5b is connected at its one end to the output side of the DAC 3, and connected at its other end to an inverting input terminal (−) of the operational amplifier 5a.

The resistor 5c is connected at its one end to the inventing input terminal (−) of the operational amplifier 5a, and connected at its other end to an output terminal of the operational amplifier 5a.

The capacitor 5d is connected at its one end to the inverting input terminal (−) of the operational amplifier 5a, and connected at its other end to the output terminal of the operational amplifier 5a.

The signal band of the differential Q signal amplified by the operational amplifier 5a is limited by the resistor 5c and the capacitor 5d.

The gain of the operational amplifier 5a is determined by $R_4/R_3$ which is a ratio of a resistance value $R_3$ of the resistor 5b to a resistance value $R_4$ of the resistor 5c, and the cut-off frequency of a loop filter which is the second loop filter circuit 5 is determined by the capacitance value of the capacitor 5d. The cut-off frequency decreases as the capacitance value of the capacitor 5d increases.

A local oscillation source 6 is a signal source that outputs a location oscillation signal.

A phase shifter 7 adjusts the phase of the local oscillation signal outputted from the local oscillation source 6, on the basis of group delay time which is the sum total of delay times of each of the quadrature modulator 8, an amplifier 9, a coupler 10, and the quadrature demodulator 12, and outputs the phase-adjusted local oscillation signal to the quadrature demodulator 12.

The quadrature modulator 8 generates a modulated wave signal from the differential I signal whose signal band is limited by the first loop filter circuit 4 and the differential Q signal whose signal band is limited by the second loop filter circuit 5.

In addition, the quadrature modulator 8 generates a harmonic signal (hereinafter, referred to as "RF signal") by converting the frequency of the generated modulated wave signal, using the local oscillation signal outputted from the local oscillation source 6, and outputs the generated RF signal to the amplifier 9.

The amplifier 9 amplifies the RF signal outputted from the quadrature modulator 8, and outputs the amplified RF signal to the coupler 10.

The coupler 10 outputs the RF signal amplified by the amplifier 9 to an output terminal 11.

In addition, when the coupler 10 outputs the RF signal to the output terminal 11, the coupler 10 outputs a part of the RF signal to the quadrature demodulator 12.

The output terminal 11 is a terminal that is intended to output the RF signal amplified by the amplifier 9, to an external.

The quadrature demodulator 12 generates a modulated wave signal by converting the frequency of the RF signal outputted from the coupler 10, using the local oscillation signal outputted from the phase shifter 7.

In addition, the quadrature demodulator 12 demodulates an analog I signal (hereinafter, referred to as "second analog I signal") and an analog Q signal (hereinafter, referred to as "second analog Q signal") from the generated modulated wave signal.

The quadrature demodulator 12 outputs the demodulated second analog I signal to the first loop filter circuit 4, and outputs the demodulated second analog Q signal to the second loop filter circuit 5.

Next, the operation of the Cartesian feedback circuit of the first embodiment will be described.

The first inverse characteristic circuit 1 has inverse frequency characteristics to the frequency characteristics of the first loop filter circuit 4.

The second inverse characteristic circuit 2 has inverse frequency characteristics to the frequency characteristics of the second loop filter circuit 5.

The frequency characteristics of the first loop filter circuit 4 and the frequency characteristics of the second loop filter circuit 5 are characteristics in which, as shown in FIG. 1, the amplitude on a high-frequency side falls and the phase on the high-frequency side is delayed.

Hence, the frequency characteristics of the first inverse characteristic circuit 1 and the frequency characteristics of the second inverse characteristic circuit 2 are characteristics in which, as shown in FIG. 1, the amplitude on the high-frequency side rises and the phase on the high-frequency side is advanced.

A digital I signal inputted to the first inverse characteristic circuit 1 does not have frequency characteristics, and has characteristics in which both amplitude and phase are flat.

In addition, a digital Q signal inputted to the second inverse characteristic circuit 2 does not have frequency characteristics, and has characteristics in which both amplitude and phase are flat.

When the digital I signal inputted to the first inverse characteristic circuit 1 passes through the first inverse characteristic circuit 1, frequency characteristics in which the amplitude on the high-frequency side rises and the phase on the high-frequency side is advanced are added to the digital I signal, and the digital I signal is outputted to the DAC 3.

When the digital Q signal inputted to the second inverse characteristic circuit 2 passes through the second inverse characteristic circuit 2, frequency characteristics in which the amplitude on the high-frequency side rises and the phase on the high-frequency side is advanced are added to the digital Q signal, and the digital Q signal is outputted to the DAC 3.

The DAC 3 converts the digital I signal outputted from the first inverse characteristic circuit 1 into an analog signal, and outputs a first analog I signal to the first loop filter circuit 4.

In addition, the DAC 3 converts the digital Q signal outputted from the second inverse characteristic circuit 2 into an analog signal, and outputs a first analog Q signal to the second loop filter circuit 5.

The first loop filter circuit 4 limits a signal band of a differential I signal which is a difference between the first analog I signal outputted from the DAC 3 and a second analog I signal outputted from the quadrature demodulator 12, and outputs the band-limited differential I signal to the quadrature modulator 8.

In the first embodiment, since the first inverse characteristic circuit 1 having inverse frequency characteristics to the frequency characteristics of the first loop filter circuit 4 is provided, even when the first loop filter circuit 4 causes a distortion in the differential I signal due to the frequency characteristics of the first loop filter circuit 4, the differential I signal outputted from the first loop filter circuit 4 does not have frequency characteristics, and has characteristics in which both amplitude and phase are flat.

In the first embodiment, a feedback loop is formed from the first loop filter circuit 4, the quadrature modulator 8, the amplifier 9, the coupler 10, and the quadrature demodulator 12, and negative feedback is applied in the feedback loop, and thus, distortion components included in the second analog I signal which is outputted from the quadrature demodulator 12 are reduced. As a result, distortion components included in an RF signal which is outputted from the amplifier 9 are reduced.

The second loop filter circuit 5 limits a signal band of a differential Q signal which is a difference between the first analog Q signal outputted from the DAC 3 and a second analog Q signal outputted from the quadrature demodulator 12, and outputs the band-limited differential Q signal to the quadrature modulator 8.

In the first embodiment, since the second inverse characteristic circuit 2 having inverse frequency characteristics to the frequency characteristics of the second loop filter circuit 5 is provided, even when the second loop filter circuit 5 causes a distortion in the differential Q signal due to the frequency characteristics of the second loop filter circuit 5, the differential Q signal outputted from the second loop filter circuit 5 does not have frequency characteristics, and has characteristics in which both amplitude and phase are flat.

In the first embodiment, a feedback loop is formed from the second loop filter circuit 5, the quadrature modulator 8, the amplifier 9, the coupler 10, and the quadrature demodulator 12, and negative feedback is applied in the feedback loop, and thus, distortion components included in the second analog Q signal which is outputted from the quadrature demodulator 12 are reduced. As a result, distortion components included in an RF signal which is outputted from the amplifier 9 are reduced.

The local oscillation source 6 oscillates a location oscillation signal, and outputs the location oscillation signal to the phase shifter 7 and the quadrature modulator 8.

When the phase shifter 7 receives the local oscillation signal from the local oscillation source 6, the phase shifter 7 adjusts the phase of the location oscillation signal on the basis of group delay time of the quadrature modulator 8, the amplifier 9, the coupler 10, and the quadrature demodulator 12, and outputs the phase-adjusted location oscillation signal to the quadrature demodulator 12.

The quadrature modulator 8 generates a modulated wave signal from the differential I signal outputted from the first loop filter circuit 4 and the differential Q signal outputted from the second loop filter circuit 5.

In addition, the quadrature modulator 8 generates an RF signal which is a harmonic signal by converting the frequency of the generated modulated wave signal, using the local oscillation signal outputted from the local oscillation source 6, and outputs the RF signal to the amplifier 9.

When the amplifier 9 receives the RF signal from the quadrature modulator 8, the amplifier 9 amplifies the RF signal and outputs the amplified RF signal to the coupler 10.

The coupler 10 outputs the RF signal amplified by the amplifier 9 to the output terminal 11.

In addition, when the coupler 10 outputs the RF signal to the output terminal 11, the coupler 10 outputs a part of the RF signal to the quadrature demodulator 12.

When the quadrature demodulator 12 receives the RF signal from the coupler 10, the quadrature demodulator 12 converts the frequency of the RF signal using the local oscillation signal outputted from the phase shifter 7, and thereby generates a modulated wave signal.

In addition, the quadrature demodulator 12 demodulates each of a second analog I signal and a second analog Q signal from the generated modulated wave signal, and outputs the demodulated second analog I signal to the first loop filter circuit 4, and outputs the demodulated second analog Q signal to the second loop filter circuit 5.

Here, FIG. 2 is Bode plots showing the performance of the Cartesian feedback circuit of FIG. 1.

The Bode plots of FIG. 2 show the gain characteristics and phase characteristics of a closed loop in the Cartesian feedback circuit of FIG. 1.

Figure 2A:
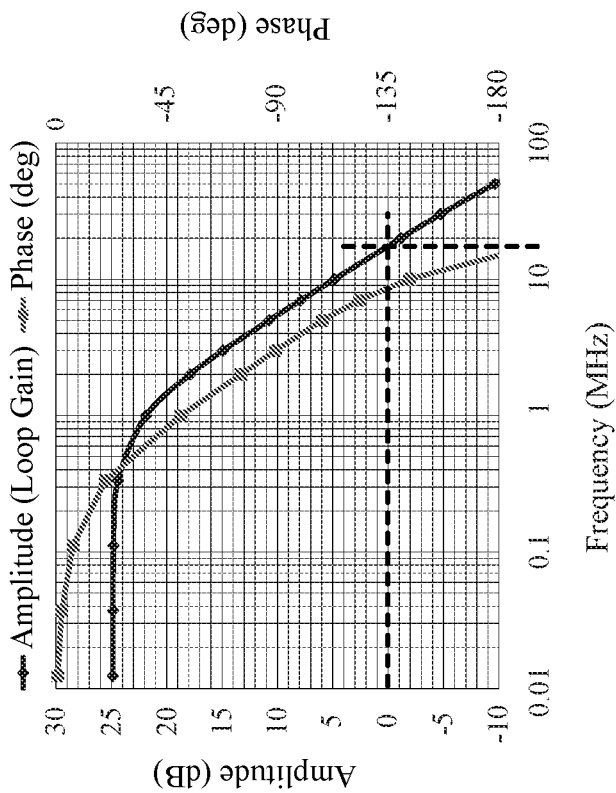
FIG. 2A is a Bode plot for when the loop gain of the Cartesian feedback circuit is 15 dB.

FIG. 2A shows a Bode plot for when the loop gain of the Cartesian feedback circuit is 15 dB, and shows a phase characteristic for when the group delay time of a closed-loop circuit is 15 ns.

The group delay time of the closed-loop circuit is determined by the sum total of delay time of the first loop filter circuit 4, the second loop filter circuit 5, the quadrature modulator 8, the amplifier 9, the coupler 10, and the quadrature demodulator 12.

Figure 2B:
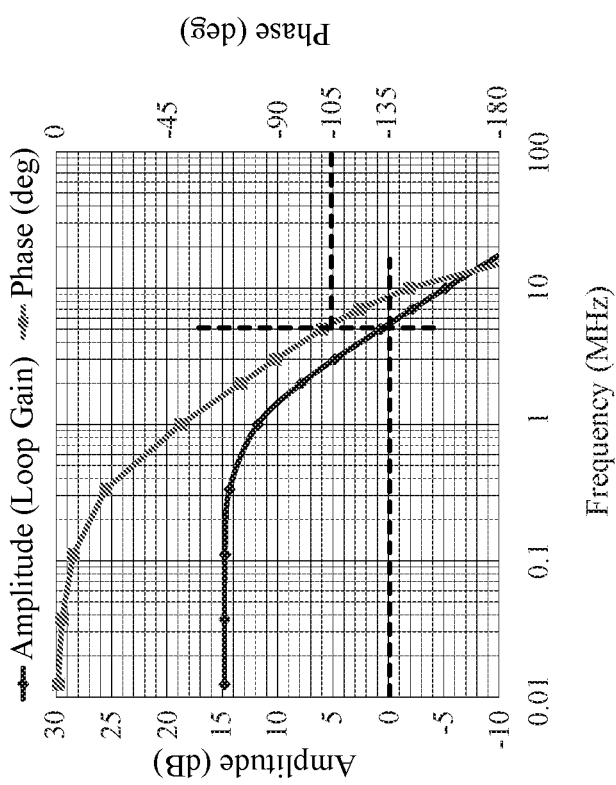
FIG. 2B is a Bode plot for when the gains of operational amplifiers 4a and 5a are increased to 30 dB.

FIG. 2B shows a Bode plot for when the gains of the operational amplifiers 4a and 5a are increased to 30 dB.

The loop gain of the Cartesian feedback circuit is determined by the gains of the operational amplifiers 4a and 5a and losses occurring in each of the quadrature modulator 8, the amplifier 9, the coupler 10, the quadrature demodulator 12, and lines. The lines are lines that connect the components of the closed-loop circuit.

Although in an example of FIG. 1 the closed-loop circuit does not include an attenuator or a variable attenuator, there is a case in which the loop gain is adjusted using an attenuator or a variable attenuator. In this case, the loop gain of the Cartesian feedback circuit is determined considering also a loss occurring in the attenuator or the variable attenuator.

From the Bode plot of FIG. 2A, the phase obtained when the loop gain of the Cartesian feedback circuit reaches 0 dB is −105 deg. and is not delayed by more than −180 deg. Hence, oscillation caused by positive feedback does not occur. The degree of phase margin at this time is 75 deg. (=180−105 deg.). Normally, the degree of phase margin on the order of 40 deg. to 80 deg. is required, considering temperature fluctuations and variations in elements.

Here, as measures for increasing the amounts of distortion compensation of the first loop filter circuit 4 and the second loop filter circuit 5, measures for increasing the loop gain of the Cartesian feedback circuit, sacrificing phase margin are assumed.

When the gains of the operational amplifiers 4a and 5a are increased to 30 dB to increase the loop gain of the Cartesian feedback circuit, as shown in FIG. 2B, the phase obtained when the loop gain reaches 0 dB is delayed by more than −180 deg. The phase margin at this time is 0 deg.

Therefore, in the measures for increasing the loop gain of the Cartesian feedback circuit, sacrificing phase margin, positive feedback is applied in the feedback loops, causing oscillation, and thus, there is a limit to increasing the loop gain.

FIG. 3 is an illustrative diagram showing a relationship between a ratio of the cut-off frequency of the first loop filter circuit 4 and the second loop filter circuit 5 to the upper limit frequency in a signal band of a modulated wave signal, and the amount of distortion compensation. In an example of FIG. 3, the signal band of the modulated wave signal is a baseband, and the signal band is from 0 to the upper limit frequency.

In a case where the Cartesian feedback circuit does not include the first inverse characteristic circuit 1 and the second inverse characteristic circuit 2, as shown in FIG. 3, when the upper limit frequency in the signal band of the modulated wave signal is higher than a frequency twice the cut-off frequency, the amount of distortion compensation is reduced to a level lower than 15 dB.

A cause of the reduction in the amount of distortion compensation is that since the gain of the modulated wave signal drops and the phase changes near the cut-off frequency of the first loop filter circuit 4 and the second loop filter circuit 5, frequency characteristics occur in the signal band of the modulated wave signal, and as a result, a distortion occurs and modulation accuracy decreases.

In the first embodiment, in order not to reduce the amount of distortion compensation and modulation accuracy with a 75-deg phase margin maintained, the Cartesian feedback circuit includes the first inverse characteristic circuit 1 and the second inverse characteristic circuit 2, preventing the change in phase and drop in gain of the modulated wave signal near the cut-off frequency of the first loop filter circuit 4 and the second loop filter circuit 5.

When the Cartesian feedback circuit includes the first inverse characteristic circuit 1 and the second inverse characteristic circuit 2, as shown in FIG. 3, even if the upper limit frequency in the signal band of the modulated wave signal is higher than a frequency twice the cut-off frequency, an amount of distortion compensation of 15 dB is obtained.

The following describes a reason that by the Cartesian feedback circuit including the first inverse characteristic circuit 1 and the second inverse characteristic circuit 2, the Cartesian feedback circuit can compensate for distortion components in a wider band than in a case of not including the first inverse characteristic circuit 1 and the second inverse characteristic circuit 2.

First, when the Cartesian feedback circuit does not include the first inverse characteristic circuit 1 and the second inverse characteristic circuit 2, a first analog I signal and a first analog Q signal which are outputted from the DAC 3 do not have frequency characteristics, and have characteristics in which both amplitude and phase are flat.

When the first analog I signal and the first analog Q signal which are outputted from the DAC 3 are inputted to the first loop filter circuit 4 and the second loop filter circuit 5, respectively, and a differential I signal and a differential Q signal are outputted from the first loop filter circuit 4 and the second loop filter circuit 5, respectively, in a case in which the upper limit frequency in a signal band of a modulated wave signal is higher than or equal to a frequency twice the cut-off frequency, the amplitude on a high-frequency side of a signal band of each of the differential I signal and the differential Q signal decreases and the phase on the high-frequency side is delayed.

Hence, the amplitude and phase of the differential I signal outputted from the first loop filter circuit 4 are shifted relative to the amplitude and phase of the first analog I signal outputted from the DAC 3.

In addition, the amplitude and phase of the differential Q signal outputted from the second loop filter circuit 5 are shifted relative to the amplitude and phase of the first analog Q signal outputted from the DAC 3.

The amplitude- and phase-shifted differential I signal and differential Q signal which are outputted from the first loop filter circuit 4 and the second loop filter circuit 5, respectively, pass through the quadrature modulator 8 and the amplifier 9, and at that time, the differential I signal and the differential Q signal are further distorted in the amplifier 9.

A part of the distorted differential I signal and differential Q signal passes through the quadrature demodulator 12, and is fed back, as a second analog I signal and a second analog Q signal, to the first loop filter circuit 4 and the second loop filter circuit 5.

The first loop filter circuit 4 and the second loop filter circuit 5 respectively take differences between the fed-back second analog I signal and second analog Q signal and the first analog I signal and first analog Q signal outputted from the DAC 3, and distortion components included in a differential I signal and a differential Q signal are compensated for by an amount of distortion compensation appropriate to the loop gain.

At this time, the amount of distortion compensation appropriate to the loop gain does not decrease almost at all when the upper limit frequency in the signal band of the modulated wave signal is lower than a frequency twice the cut-off frequency.

However, when the upper limit frequency in the signal band of the modulated wave signal is higher than the frequency twice the cut-off frequency, the amount of distortion compensation and modulation accuracy decrease with the reduction in amplitude and the delay in phase on the high-frequency side. Hence, the amount of compensation that can be made to distortion components included in the differential I signal and the differential Q signal decreases, and the distortion components cannot be sufficiently compensated for.

Next, when the Cartesian feedback circuit includes the first inverse characteristic circuit 1 and the second inverse characteristic circuit 2, frequency characteristics in which the amplitude on the high-frequency side rises and the phase on the high-frequency side is advanced are added to a digital I signal and a digital Q signal which are outputted from the first inverse characteristic circuit 1 and the second inverse characteristic circuit 2.

When a first analog I signal and a first analog Q signal which are outputted from the DAC 3 are inputted to the first loop filter circuit 4 and the second loop filter circuit 5, respectively, and a differential I signal and a differential Q signal are outputted from the first loop filter circuit 4 and the second loop filter circuit 5, respectively, inverse frequency characteristics to the frequency characteristics of the first inverse characteristic circuit 1 and inverse frequency characteristics to the frequency characteristics of the second inverse characteristic circuit 2 are added to the differential I signal and the differential Q signal, respectively. Hence, each of the differential I signal outputted from the first loop filter circuit 4 and the differential Q signal outputted from the second loop filter circuit 5 does not have frequency characteristics, and has characteristics in which both amplitude and phase are flat.

The differential I signal and the differential Q signal that do not have frequency characteristics pass through the quadrature modulator 8 and the amplifier 9, and at that time, the differential I signal and the differential Q signal are distorted in the amplifier 9.

A part of the distorted differential I signal and differential Q signal passes through the quadrature demodulator 12, and is fed back, as a second analog I signal and a second analog Q signal, to the first loop filter circuit 4 and the second loop filter circuit 5.

The first loop filter circuit 4 and the second loop filter circuit 5 respectively take differences between the fed-back second analog I signal and second analog Q signal and the first analog I signal and first analog Q signal outputted from the DAC 3, and distortion components included in a differential I signal and a differential Q signal are compensated for by an amount of distortion compensation appropriate to the loop gain.

When the Cartesian feedback circuit includes the first inverse characteristic circuit 1 and the second inverse characteristic circuit 2, each of the differential I signal outputted from the first loop filter circuit 4 and the differential Q signal outputted from the second loop filter circuit 5 does not have frequency characteristics, and has characteristics in which both amplitude and phase are flat. Hence, even when the upper limit frequency in a signal band of a modulated wave signal is higher than or equal to a frequency twice the cut-off frequency, the amount of distortion compensation does not decrease.

Therefore, when the first inverse characteristic circuit 1 and the second inverse characteristic circuit 2 are included, a large amount of distortion compensation is obtained in a wider band than in a case of not including the first inverse characteristic circuit 1 and the second inverse characteristic circuit 2, and thus, distortion components included in the differential I signal and the differential Q signal can be compensated for.

In the above-described first embodiment, it is configured to output a first I signal having passed through the first inverse characteristic circuit 1 having inverse frequency characteristics to the frequency characteristics of the first loop filter circuit 4, to the first loop filter circuit 4, and output a first Q signal having passed through the second inverse characteristic circuit 2 having inverse frequency characteristics to the frequency characteristics of the second loop filter circuit 5, to the second loop filter circuit 5. Therefore, a Cartesian feedback circuit in which a change in gain and a change in phase caused by loop filters do not occur can be obtained.

Although the first embodiment shows an example in which complex FIR filters or complex IIR filters are used as the first inverse characteristic circuit 1 and the second inverse characteristic circuit 2, the configuration is not limited thereto, and the first inverse characteristic circuit 1 and the second inverse characteristic circuit 2 may be any as long as the first inverse characteristic circuit 1 and the second inverse characteristic circuit 2 have inverse frequency characteristics to the frequency characteristics of the first loop filter circuit 4 and the second loop filter circuit 5, respectively.

Note that when the first inverse characteristic circuit 1 and the second inverse characteristic circuit 2 have inverse frequency characteristics to the frequency characteristics of the first loop filter circuit 4 and the second loop filter circuit 5, respectively, up to a frequency about twice the upper limit frequency in a signal band of a modulated wave signal, a frequency at which the amount of distortion compensation deteriorates does not occur in the signal band.

Second Embodiment

The above-described first embodiment shows an example in which a Cartesian feedback circuit includes the first inverse characteristic circuit 1 having inverse frequency characteristics to the frequency characteristics of the first loop filter circuit 4; and the second inverse characteristic circuit 2 having inverse frequency characteristics to the frequency characteristics of the second loop filter circuit 5.

In this second embodiment, an example in which the coefficient of the complex FIR filter or the coefficient of the complex IIR filter in the first inverse characteristic circuit 1 is adjusted on the basis of the frequency characteristics of the first loop filter circuit 4, and the coefficient of the complex FIR filter or the coefficient of the complex IIR filter in the second inverse characteristic circuit 2 is adjusted on the basis of the frequency characteristics of the second loop filter circuit 5, will be described.

Figure 4:
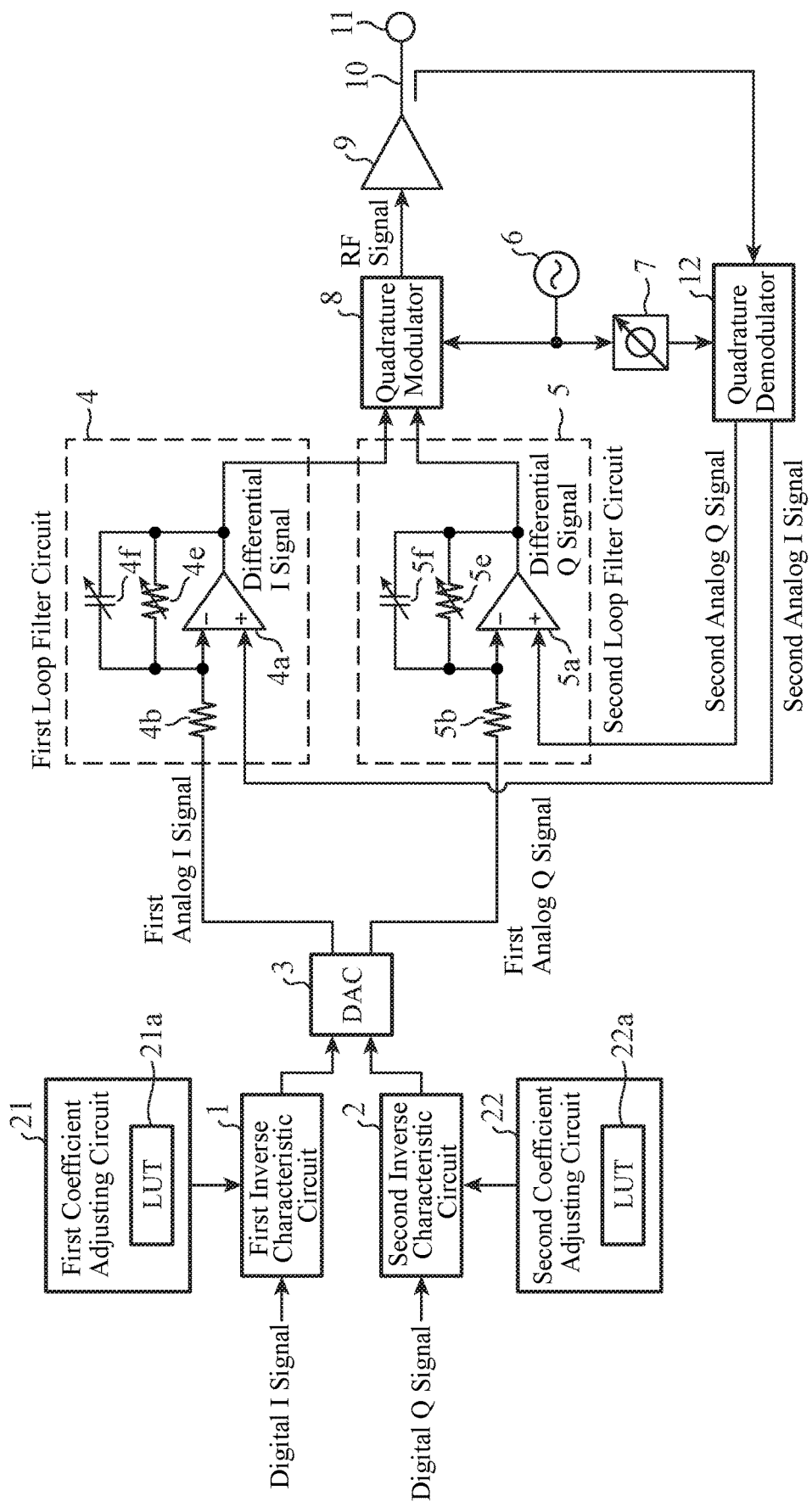
FIG. 4 is a configuration diagram showing a Cartesian feedback circuit of a second embodiment.

FIG. 4 is a configuration diagram showing a Cartesian feedback circuit of the second embodiment. In FIG. 4, the same reference signs as those of FIG. 1 denote the same or corresponding portions and thus description thereof is omitted.

In the second embodiment, the first loop filter circuit 4 includes a variable resistor 4e instead of the resistor 4c, and includes a variable capacitor 4f instead of the capacitor 4d.

The second loop filter circuit 5 includes a variable resistor 5e instead of the resistor 5c, and includes a variable capacitor 5f instead of the capacitor 5d.

When the first inverse characteristic circuit 1 is a complex FIR filter or a complex IIR filter, a first coefficient adjusting circuit 21 includes a lookup table (hereinafter, referred to as "LUT") 21a that stores a coefficient of the complex FIR filter or a coefficient of the complex IIR filter appropriate to the frequency characteristics of the first loop filter circuit 4.

The first coefficient adjusting circuit 21 adjusts the coefficient of the complex FIR filter or the coefficient of the complex IIR filter in the first inverse characteristic circuit 1 to a coefficient appropriate to the frequency characteristics of the first loop filter circuit 4 by referring to the LUT 21a.

When the second inverse characteristic circuit 2 is a complex FIR filter or a complex IIR filter, a second coefficient adjusting circuit 22 includes a LUT 22a that stores a coefficient of the complex FIR filter or a coefficient of the complex IIR filter appropriate to the frequency characteristics of the second loop filter circuit 5.

The second coefficient adjusting circuit 22 adjusts the coefficient of the complex FIR filter or the coefficient of the complex IIR filter in the second inverse characteristic circuit 2 to a coefficient appropriate to the frequency characteristics of the second loop filter circuit 5 by referring to the LUT 22a.

Note that changing the frequency characteristics by adjusting the coefficient of the complex FIR filter or the coefficient of the complex IIR filter itself is a publicly known technique and thus a detailed description thereof is omitted.

Next, the operation of the Cartesian feedback circuit of the second embodiment will be described.

A signal band of a modulated wave signal including a digital I signal and a digital Q signal may vary from communication system to communication system. Hence, if it is possible to change each of the frequency characteristics of the first loop filter circuit 4 and the frequency characteristics of the second loop filter circuit 5, then the Cartesian feedback circuit can be applied to many communication systems.

Hence, in the second embodiment, the first loop filter circuit 4 includes the variable resistor 4e and the variable capacitor 4f so that a loop gain determined by the gain of the operational amplifier 4a, etc., and the cut-off frequency of the first loop filter circuit 4 can be adjusted as frequency characteristics of the first loop filter circuit 4.

In addition, the second loop filter circuit 5 includes the variable resistor 5e and the variable capacitor 5f so that a loop gain determined by the gain of the operational amplifier 5a, etc., and the cut-off frequency of the second loop filter circuit 5 can be adjusted as frequency characteristics of the second loop filter circuit 5.

The Cartesian feedback circuit of the second embodiment includes the first coefficient adjusting circuit 21 so that, when the frequency characteristics of the first loop filter circuit 4 have been changed, the first inverse characteristic circuit 1 has inverse frequency characteristics to the frequency characteristics of the first loop filter circuit 4.

In addition, the Cartesian feedback circuit of the second embodiment includes the second coefficient adjusting circuit 22 so that, when the frequency characteristics of the second loop filter circuit 5 have been changed, the second inverse characteristic circuit 2 has inverse frequency characteristics to the frequency characteristics of the second loop filter circuit 5.

When the first inverse characteristic circuit 1 is a complex FIR filter or a complex IIR filter, the first coefficient adjusting circuit 21 includes the LUT 21a that stores a coefficient of the complex FIR filter or a coefficient of the complex IIR filter appropriate to the frequency characteristics of the first loop filter circuit 4.

The LUT 21a stores a coefficient appropriate to a combination of the resistance value of the variable resistor 4e and the capacitance value of the variable capacitor 4f, as the coefficient of the complex FIR filter or the coefficient of the complex IIR filter appropriate to the frequency characteristics of the first loop filter circuit 4.

The first coefficient adjusting circuit 21 obtains a coefficient of the complex FIR filter or a coefficient of the complex IIR filter appropriate to a combination of the resistance value of the variable resistor 4e and the capacitance value of the variable capacitor 4f, by referring to the LUT 21a.

Each of the resistance value of the variable resistor 4e and the capacitance value of the variable capacitor 4f may be manually provided to the first coefficient adjusting circuit 21 by a user, or may be provided to the first coefficient adjusting circuit 21 by communication from an external apparatus, etc.

The first coefficient adjusting circuit 21 sets the coefficient of the complex FIR filter or the coefficient of the complex IIR filter in the first inverse characteristic circuit 1 to the obtained coefficient, and thereby sets the frequency characteristics of the first inverse characteristic circuit 1 to inverse frequency characteristics to the frequency characteristics of the first loop filter circuit 4.

When the second inverse characteristic circuit 2 is a complex FIR filter or a complex IIR filter, the second coefficient adjusting circuit 22 includes the LUT 22a that stores a coefficient of the complex FIR filter or a coefficient of the complex IIR filter appropriate to the frequency characteristics of the second loop filter circuit 5.

The LUT 22a stores a coefficient appropriate to a combination of the resistance value of the variable resistor 5e and the capacitance value of the variable capacitor 5f, as the coefficient of the complex FIR filter or the coefficient of the complex IIR filter appropriate to the frequency characteristics of the second loop filter circuit 5.

The second coefficient adjusting circuit 22 obtains a coefficient of the complex FIR filter or a coefficient of the complex filter appropriate to a combination of the resistance value of the variable resistor Se and the capacitance value of the variable capacitor 5f, by referring to the LUT 22a.

Each of the resistance value of the variable resistor 5e and the capacitance value of the variable capacitor 5f may be manually provided to the second coefficient adjusting circuit 22 by the user, or may be provided to the second coefficient adjusting circuit 22 by communication from an external apparatus, etc.

The second coefficient adjusting circuit 22 sets the coefficient of the complex FIR filter or the coefficient of the complex IIR filter in the second inverse characteristic circuit 2 to the obtained coefficient, and thereby sets the frequency characteristics of the second inverse characteristic circuit 2 to inverse frequency characteristics to the frequency characteristics of the second loop filter circuit 5.

Therefore, even if the signal band of a modulated wave signal which is inputted to the Cartesian feedback circuit is changed, distortions occurring in the amplifier 9 can be compensated for.

For example, a case in which the modulated wave signal is a signal with a symbol rate of 512 ksps, 256 ksps, or 25.6 ksps is considered. In this case, the capacitance values of the capacitors 4f and 5f are set in such a manner that, for example, the cut-off frequency of the first loop filter circuit 4 and the cut-off frequency of the second loop filter circuit 5 are equal to 1× (the upper limit frequency) in a signal band of the modulated wave signal. Specifically, the capacitance values of the capacitors 4f and 5f are set in such a manner that the cut-off frequency of the first loop filter circuit 4 and the cut-off frequency of the second loop filter circuit 5 are 512 kHz, 256 kHz, or 25.6 kHz.

In addition, the resistance values of the variable resistors 4e and 5e are set in such a manner that, for example, a loop gain having a 75-deg phase margin is obtained.

At this time, by the first coefficient adjusting circuit 21 and the second coefficient adjusting circuit 22 setting the coefficients of the complex FIR filters or the coefficients of the complex IIR filters to coefficients of the complex FIR filters or coefficients of the complex IIR filters appropriate to combinations of the resistance values of the variable resistors 4e and 5e and the capacitance values of the capacitors 4f and 5f, an amount of distortion compensation of, for example, 15 dB, 21 dB, or 41 dB is obtained.

Third Embodiment

In this third embodiment, an example in which a Cartesian feedback circuit includes a signal compensating circuit 31 that compensates for an RF signal generated by the quadrature modulator 8, so as to increase the linearity of the amplifier 9 and eliminate the hysteresis of the amplifier 9, will be described.

Figure 5:
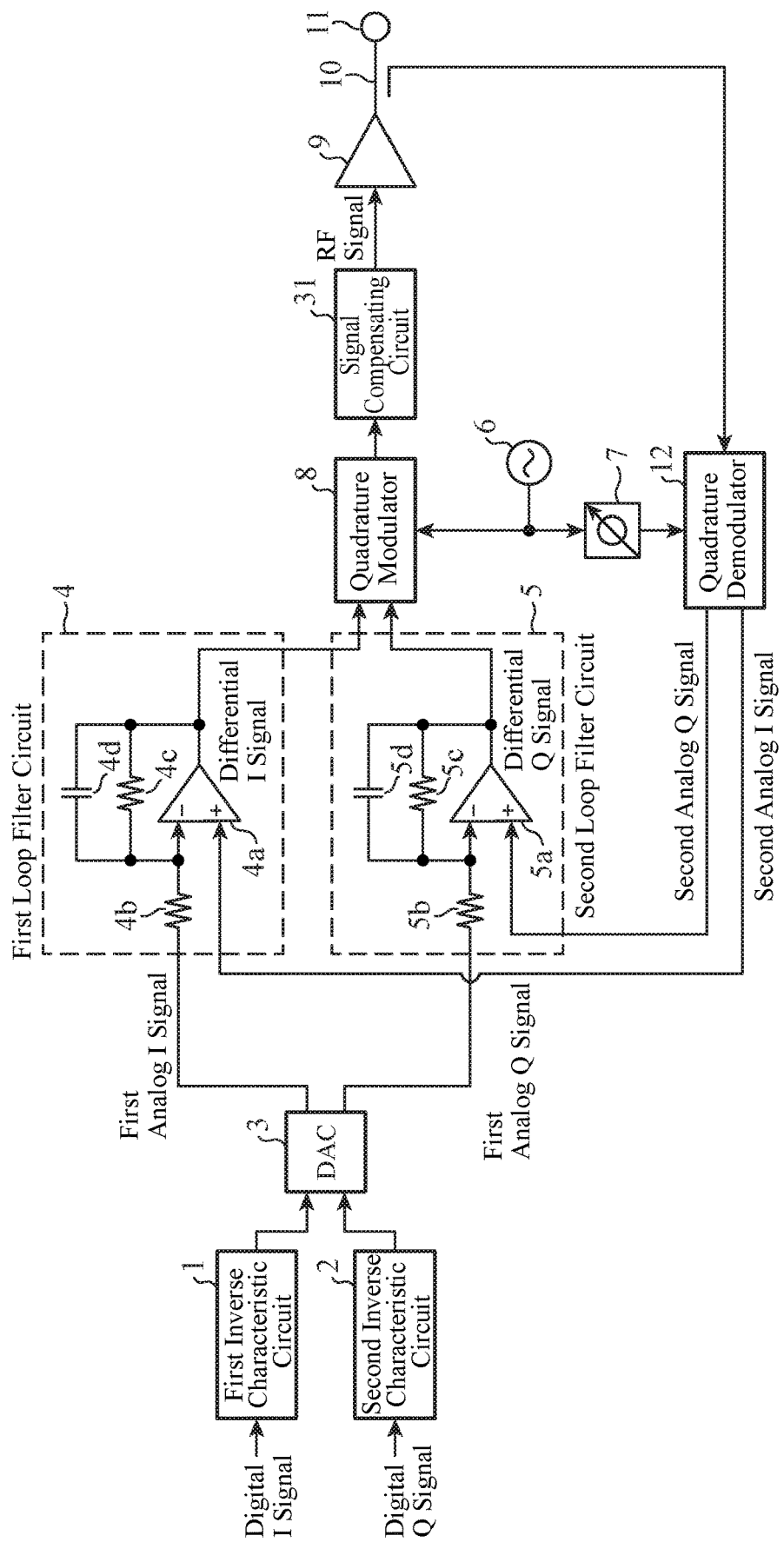
FIG. 5 is a configuration diagram showing a Cartesian feedback circuit of a third embodiment.

FIG. 5 is a configuration diagram showing a Cartesian feedback circuit of the third embodiment. In FIG. 5, the same reference signs as those of FIG. 1 denote the same or corresponding portions and thus description thereof is omitted.

The signal compensating circuit 31 is provided between the quadrature modulator 8 and the amplifier 9, and compensates for an RF signal generated by the quadrature modulator 8, so as to increase the linearity of the amplifier 9 and eliminate the hysteresis of the amplifier 9, and outputs the compensated RF signal to the amplifier 9.

Although FIG. 5 shows an example in which the signal compensating circuit 31 is applied to the Cartesian feedback circuit of FIG. 1, the signal compensating circuit 31 may be applied to the Cartesian feedback circuit of FIG. 4.

Next, the operation of the Cartesian feedback circuit of the third embodiment will be described.

In the above-described first embodiment, the Cartesian feedback circuit includes the first inverse characteristic circuit 1 and the second inverse characteristic circuit 2 to suppress a reduction in the amount of distortion compensation, but when the characteristics of the amplifier 9 are non-linear or the amplifier 9 has hysteresis, an RF signal outputted from the amplifier 9 becomes non-linear.

In general, the characteristics of the amplifier 9 are non-linear and have hysteresis.

In the third embodiment, in order to make an RF signal outputted from the amplifier 9 linear, the signal compensating circuit 31 is provided that compensates for an RF signal generated by the quadrature modulator 8, so as to increase the linearity of the amplifier 9 and eliminate the hysteresis of the amplifier 9.

The signal compensating circuit 31 is implemented by, for example, a diode linearizer.

A compensation process for an RF signal by a diode linearizer itself is a publicly known technique and thus a detailed description thereof is omitted, but the diode linearizer includes one or more diodes and a control voltage is fed to the one or more diodes through a resistor. By adjusting the control voltage at the one or more diodes, the amount of compensation for an RF signal can be adjusted.

In the above-described third embodiment, it is configured to include the signal compensating circuit 31 that is provided between the quadrature modulator 8 and the amplifier 9, and compensates for an RF signal generated by the quadrature modulator 8, so as to increase the linearity of the amplifier 9 and eliminate the hysteresis of the amplifier 9, and outputs the compensated RF signal to the amplifier 9. Therefore, an RF signal amplified by the amplifier 9 can be made linear. By the RF signal which is amplified by the amplifier 9 becoming linear, for example, three-dimensional distortions are reduced.

Fourth Embodiment

In the above-described third embodiment, an example in which the signal compensating circuit 31 is provided in the feedback loops of the Cartesian feedback circuit, by which the linearity of the amplifier 9 is increased and the hysteresis of the amplifier 9 is eliminated, is shown.

In this fourth embodiment, an example in which a Cartesian feedback circuit includes a first signal compensating circuit 41 and a second signal compensating circuit 42 on the input sides of the feedback loops, will be described.

Figure 6:
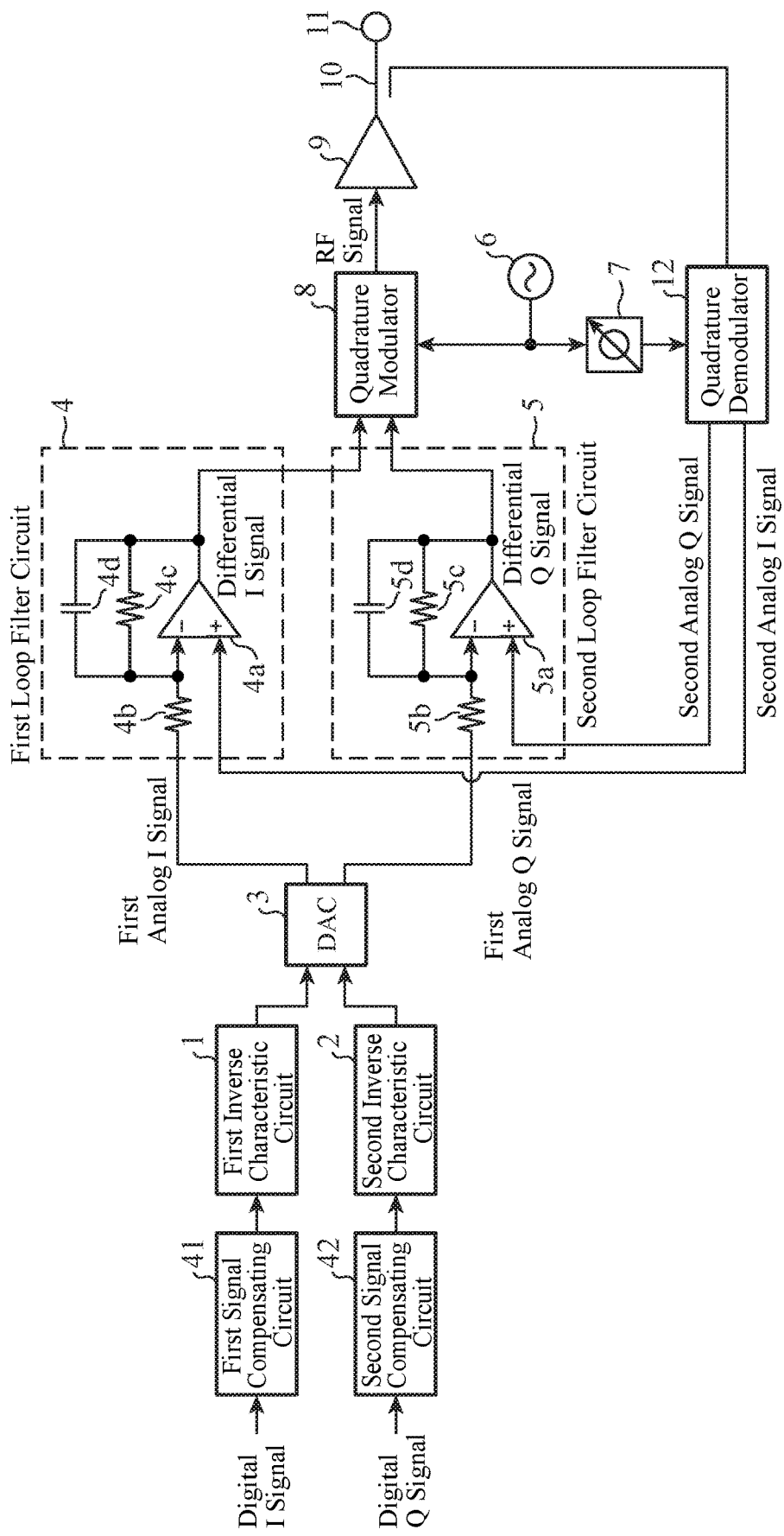
FIG. 6 is a configuration diagram showing a Cartesian feedback circuit of a fourth embodiment.

FIG. 6 is a configuration diagram showing a Cartesian feedback circuit of the fourth embodiment. In FIG. 6, the same reference signs as those of FIG. 1 denote the same or corresponding portions and thus description thereof is omitted.

The first signal compensating circuit 41 is implemented by, for example, an open-loop digital predistortion (DPD).

The first signal compensating circuit 41 is provided at a previous stage to the first inverse characteristic circuit 1, and compensates for an inputted digital I signal so as to increase the linearity of the Cartesian feedback circuit, and outputs the compensated digital I signal to the first inverse characteristic circuit 1.

The second signal compensating circuit 42 is implemented by, for example, a DPD.

The second signal compensating circuit 42 is provided at a previous stage to the second inverse characteristic circuit 2, and compensates for an inputted digital Q signal so as to increase the linearity of the Cartesian feedback circuit, and outputs the compensated digital Q signal to the second inverse characteristic circuit 2.

Although FIG. 6 shows an example in which the first signal compensating circuit 41 and the second signal compensating circuit 42 are applied to the Cartesian feedback circuit of FIG. 1, the first signal compensating circuit 41 and the second signal compensating circuit 42 may be applied to the Cartesian feedback circuit of FIG. 4.

Next, the operation of the Cartesian feedback circuit of the fourth embodiment will be described.

The first signal compensating circuit 41 is implemented by, for example, a DPD and the DPD includes a linearity correction table TBL1.

The linearity correction table TBL1 stores a correspondence relationship between a linear digital I signal which is an input signal to the first signal compensating circuit 41 and an output signal from the first signal compensating circuit 41 obtained when an analog I signal included in an RF signal outputted from the amplifier 9 becomes linear.

The first signal compensating circuit 41 identifies an output signal associated with a digital I signal which is an input signal by referring to the correction table TBL1, and outputs the output signal, as a digital I signal, to the first inverse characteristic circuit 1.

The second signal compensating circuit 42 is implemented by, for example, a DPD and the DPD includes a linearity correction table TBL2.

The linearity correction table TBL2 stores a correspondence relationship between a linear digital Q signal which is an input signal to the second signal compensating circuit 42 and an output signal from the second signal compensating circuit 42 obtained when an analog Q signal included in an RF signal outputted from the amplifier 9 becomes linear.

The second signal compensating circuit 42 identifies an output signal associated with a digital Q signal which is an input signal by referring to the correction table TBL2, and outputs the output signal, as a digital Q signal, to the second inverse characteristic circuit 2.

Although an example in which the correction tables TBL1 and TBL2 respectively store correspondence relationships between an input signal and an output signal to/from the first signal compensating circuit 41 and the second signal compensating circuit 42, is shown here, the configuration is not limited thereto as long as a digital I signal and a digital Q signal can be compensated for so as to increase the linearity of the Cartesian feedback circuit. Hence, the correction tables TBL1 and TBL2 may store, for example, information for adjusting the amplitudes and phases of a digital I signal and a digital Q signal which are input signals to the first signal compensating circuit 41 and the second signal compensating circuit 42, instead of storing correspondence relationships between an input signal and an output signal.

In the above-described fourth embodiment, it is configured to include the first signal compensating circuit 41 that is provided at a previous stage to the first inverse characteristic circuit 1, and compensates for an inputted digital I signal so as to increase the linearity of the Cartesian feedback circuit, and outputs the compensated digital I signal to the first inverse characteristic circuit 1; and the second signal compensating circuit 42 that is provided at a previous stage to the second inverse characteristic circuit 2, and compensates for an inputted digital Q signal so as to increase the linearity of the Cartesian feedback circuit, and outputs the compensated digital Q signal to the second inverse characteristic circuit 2. Therefore, an RF signal amplified by the amplifier 9 can be made linear.

Fifth Embodiment

In the above-described fourth embodiment, an example is which the first signal compensating circuit 41 compensates for an inputted digital I signal, and the second signal compensating circuit 42 compensates for an inputted digital Q signal, is shown.

In this fifth embodiment, an example in which a Cartesian feedback circuit includes a first signal compensating circuit 54 that compensates for a digital I signal; and a second signal compensating circuit 55 that compensates for a digital Q signal, so as to increase the linearity of the Cartesian feedback circuit and eliminate the hysteresis of the Cartesian feedback circuit, will be described.

Figure 7:
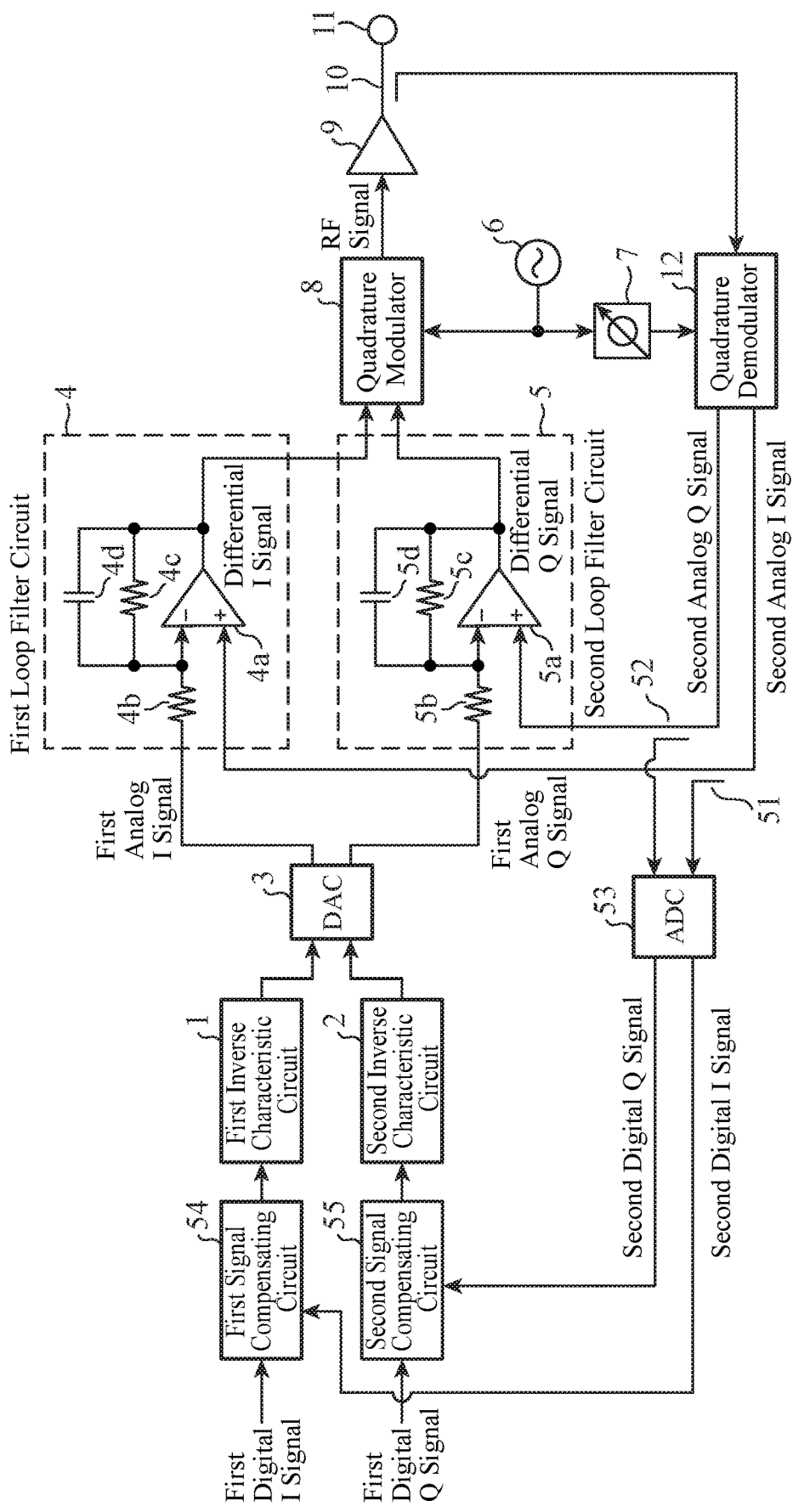
FIG. 7 is a configuration diagram showing a Cartesian feedback circuit of a fifth embodiment.

FIG. 7 is a configuration diagram showing a Cartesian feedback circuit of the fifth embodiment. In FIG. 7, the same reference signs as those of FIG. 1 denote the same or corresponding portions and thus description thereof is omitted.

A coupler 51 outputs a part of a second analog I signal outputted from the quadrature demodulator 12, to an ADC 53 which is an analog-to-digital converter.

A coupler 52 outputs a part of a second analog Q signal outputted from the quadrature demodulator 12, to the ADC 53.

The ADC 53 is an analog-to-digital converter that converts an analog signal into a digital signal, and converts the second analog I signal outputted from the coupler 51 into a second digital I signal, and outputs the second digital I signal to the first signal compensating circuit 54.

In addition, the ADC 53 converts the second analog Q signal outputted from the coupler 52 into a second digital Q signal, and outputs the second digital Q signal to the second signal compensating circuit 55.

The first signal compensating circuit 54 is implemented by, for example, an adaptive digital predistortion (ADPD) which is a closed-loop digital predistortion.

The first signal compensating circuit 54 compensates for an inputted first I signal (hereinafter, referred to as "first digital I signal") on the basis of the second digital I signal outputted from the ADC 53, so as to increase the linearity of the Cartesian feedback circuit and eliminate the hysteresis of the Cartesian feedback circuit, and outputs the compensated first digital I signal to the first inverse characteristic circuit 1.

The second signal compensating circuit 55 is implemented by, for example, an ADPD.

The second signal compensating circuit 55 compensates for an inputted first Q signal (hereinafter, referred to as "first digital Q signal") on the basis of the second digital Q signal outputted from the ADC 53, so as to increase the linearity of the Cartesian feedback circuit and eliminate the hysteresis of the Cartesian feedback circuit, and outputs the compensated first digital Q signal to the second inverse characteristic circuit 2.

Although FIG. 7 shows an example in which the couplers 51 and 52, the ADC 53, the first signal compensating circuit 54, and the second signal compensating circuit 55 are applied to the Cartesian feedback circuit of FIG. 1, the couplers 51 and 52, the ADC 53, the first signal compensating circuit 54, and the second signal compensating circuit 55 may be applied to the Cartesian feedback circuit of FIG. 4.

Next, the operation of the Cartesian feedback circuit of the fifth embodiment will be described.

The coupler 51 outputs a part of a second analog I signal outputted from the quadrature demodulator 12, to the ADC 53.

The coupler 52 outputs a part of a second analog Q signal outputted from the quadrature demodulator 12, to the ADC 53.

The ADC 53 converts the second analog I signal outputted from the coupler 51 into a second digital I signal, and outputs the second digital I signal to the first signal compensating circuit 54.

In addition, the ADC 53 converts the second analog Q signal outputted from the coupler 52 into a second digital Q signal, and outputs the second digital Q signal to the second signal compensating circuit 55.

The first signal compensating circuit 54 is implemented by, for example, an ADPD and the ADPD includes a linearity correction table TBL3.

The linearity correction table TBL3 stores a correspondence relationship between a linear difference between a first digital I signal and a second digital I signal, and an output signal from the first signal compensating circuit 54 obtained when an analog I signal included in an RF signal outputted from the amplifier 9 becomes linear.

The first signal compensating circuit 54 calculates a difference between an inputted first digital I signal and the second digital I signal outputted from the ADC 53.

The first signal compensating circuit 54 identifies an output signal associated with the calculated difference by referring to the correction table TBL3, and outputs the output signal, as a digital I signal, to the first inverse characteristic circuit 1.

The second signal compensating circuit 55 is implemented by, for example, an ADPD and the ADPD includes a linearity correction table TBL4.

The linearity correction table TBL4 stores a correspondence relationship between a linear difference between a first digital Q signal and a second digital Q signal, and an output signal from the second signal compensating circuit 55 obtained when an analog Q signal included in an RF signal outputted from the amplifier 9 becomes linear.

The second signal compensating circuit 55 calculates a difference between an inputted first digital Q signal and the second digital Q signal outputted from the ADC 53.

The second signal compensating circuit 55 identifies an output signal associated with the calculated difference by referring to the correction table TBL4, and outputs the output signal, as a digital Q signal, to the second inverse characteristic circuit 2.

In the fifth embodiment, in order to not only increase the linearity of the Cartesian feedback circuit but also eliminate the hysteresis of the Cartesian feedback circuit, the correction tables TBL3 and TBL4 use a memory polynomial (MP) that performs memory effect compensation, as an algorithm for eliminating hysteresis.

Although in the fifth embodiment an example in which not only the linearity of the Cartesian feedback circuit is increased, is shown, but also the hysteresis of the Cartesian feedback circuit is eliminated, only the linearity of the Cartesian feedback circuit may be increased.

In the above-described fifth embodiment, it is configured to include the first signal compensating circuit 54 that compensates for an inputted first digital I signal on the basis of a second digital I signal outputted from the ADC 53, so as to increase the linearity of the Cartesian feedback circuit and eliminate the hysteresis of the Cartesian feedback circuit, and outputs the compensated first digital I signal to the first inverse characteristic circuit 1; and the second signal compensating circuit 55 that compensates for an inputted first digital Q signal on the basis of a second digital Q signal outputted from the ADC 53, so as to increase the linearity of the Cartesian feedback circuit and eliminate the hysteresis of the Cartesian feedback circuit, and outputs the compensated first digital Q signal to the second inverse characteristic circuit 2. Therefore, an advantageous effect of being able to make an RF signal amplified by the amplifier 9 linear. In addition, even if temperature changes or deterioration over time occurs, a linear RF signal can be obtained.

FIG. 7 shows an example in which the ADC 53 convers a second analog I signal outputted from the coupler 51 into a second digital I signal, and converts a second analog Q signal outputted from the coupler 52 into a second digital Q signal.

Figure 8:
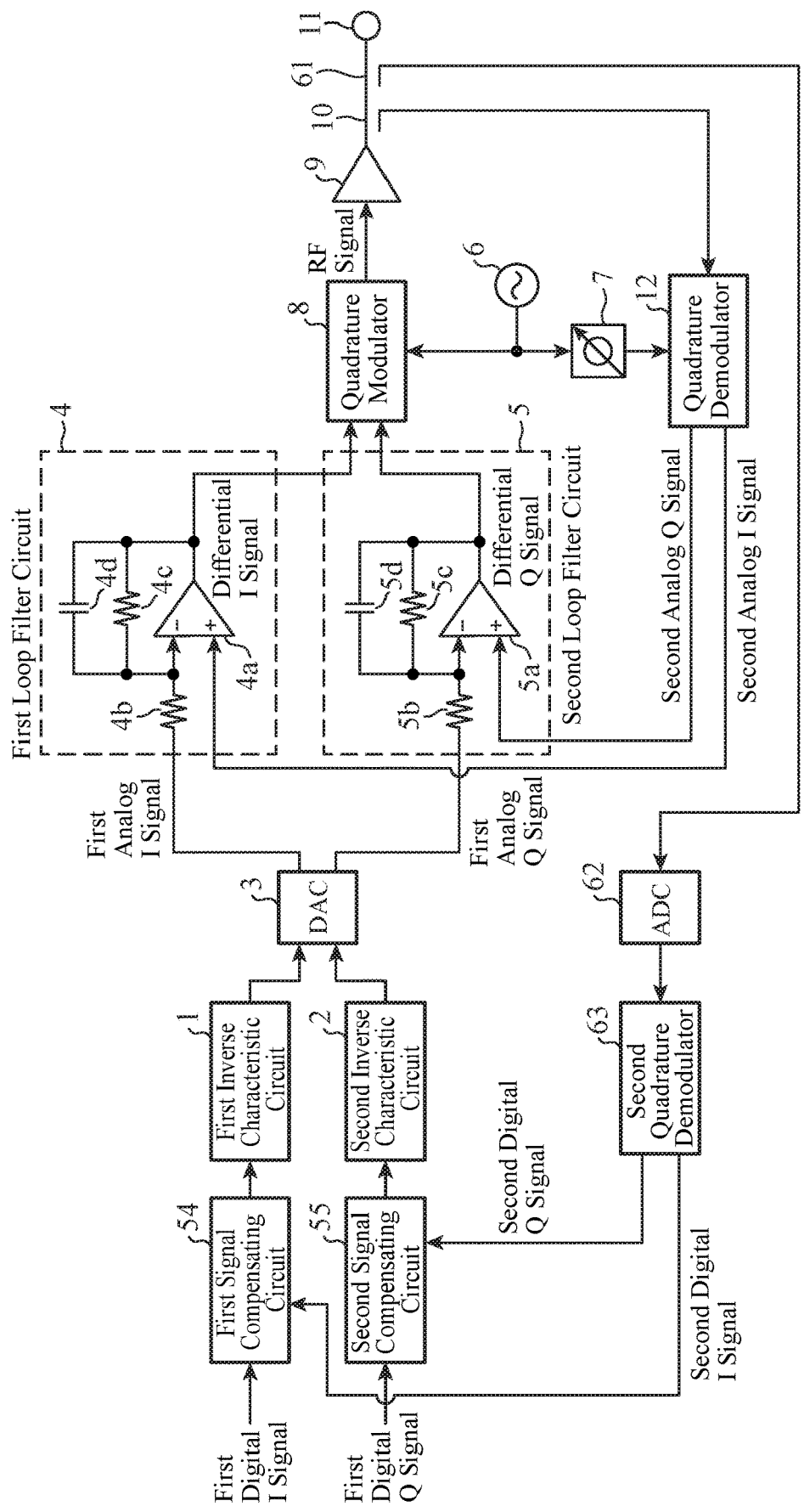
FIG. 8 is a configuration diagram showing another Cartesian feedback circuit of the fifth embodiment.

This is merely an example, and for example, a Cartesian feedback circuit may be formed as shown in FIG. 8.

FIG. 8 is a configuration diagram showing another Cartesian feedback circuit of the fifth embodiment.

The Cartesian feedback circuit of FIG. 8 includes a coupler 61, an ADC 62, and a second quadrature demodulator 63.

The coupler 61 outputs a part of an RF signal amplified by the amplifier 9 to the ADC 62.

The ADC 62 converts the RF signal outputted from the coupler 61 into a digital RF signal, and outputs the digital RF signal to the second quadrature demodulator 63.

The second quadrature demodulator 63 demodulates a second digital I signal and a second digital Q signal from the digital RF signal outputted from the ADC 62, and outputs the demodulated second digital I signal to the first signal compensating circuit 54, and outputs the demodulated second digital Q signal to the second signal compensating circuit 55.

The details of processes performed by the first signal compensating circuit 54 and the second signal compensating circuit 55 are the same as those of the Cartesian feedback circuit of FIG. 7.

Note that in the invention of the present application, a free combination of the embodiments, modifications to any component of the embodiments, or omissions of any component in the embodiments are possible within the scope of the invention.

INDUSTRIAL APPLICABILITY

The invention is suitable for use as a Cartesian feedback circuit including loop filters that limit signal bands.

REFERENCE SIGNS LIST

1: First inverse characteristic circuit,
2: Second inverse characteristic circuit,
3: DAC,
4: First loop filter circuit,
4a: Operational amplifier,
4b and 4c: Resistor,
4d: Capacitor, 4e: Variable resistor,
4f: Variable capacitor,
5: Second loop filter circuit,
5a: Operational amplifier,
5b and 5c: Resistor,
5d: Capacitor,
5e: Variable resistor,
5f: Variable capacitor,
6: Local oscillation source,
7: Phase shifter,
8: Quadrature modulator,
9: Amplifier,
10: Coupler,
11: Output terminal,
12: Quadrature demodulator,
21: First coefficient adjusting circuit,
21a: LUT,
22: Second coefficient adjusting circuit,
22a: LUT,
31: Signal compensating circuit,
41: First signal compensating circuit,
42: Second signal compensating circuit,
51 and 52: Coupler,
53: ADC,
54: First signal compensating circuit,
55: Second signal compensating circuit,
61: Coupler,
62: ADC,
63: Second quadrature demodulator.

The invention claimed is:

1. A Cartesian feedback circuit comprising:
a first loop filter circuit to limit a signal band of a differential I signal, the differential I signal being a difference between a first I signal and a second I signal, the first I signal being an in-phase component of a modulated wave signal, the second I signal being an in-phase component of an amplified harmonic signal;
a second loop filter circuit to limit a signal band of a differential Q signal, the differential Q signal being a difference between a first Q signal and a second Q signal, the first Q signal being a quadrature-phase component of the modulated wave signal, the second Q signal being a quadrature-phase component of the harmonic signal;
a quadrature modulator to generate a harmonic signal from the signal-band-limited differential I signal and the signal-band-limited differential Q signal;
an amplifier to amplify the harmonic signal generated by the quadrature modulator;
a quadrature demodulator to demodulate each of the second I signal and the second Q signal from the harmonic signal amplified by the amplifier;
a first inverse characteristic circuit having inverse frequency characteristics to frequency characteristics of the first loop filter circuit; and
a second inverse characteristic circuit having inverse frequency characteristics to frequency characteristics of the second loop filter circuit, wherein
a first digital I signal is inputted to the first inverse characteristic circuit, and a first digital Q signal is inputted to the second inverse characteristic circuit.

2. The Cartesian feedback circuit according to claim 1, wherein the first and second inverse characteristic circuits are circuits including a complex finite impulse response (FIR) filter or a complex infinite impulse response (IIR) filter.

3. The Cartesian feedback circuit according to claim 2, comprising:
a first coefficient adjusting circuit to adjust a coefficient of the complex FIR filter or a coefficient of the complex IIR filter in the first inverse characteristic circuit, on a basis of frequency characteristics of the first loop filter circuit; and
a second coefficient adjusting circuit to adjust a coefficient of the complex FIR filter or a coefficient of the complex IIR filter in the second inverse characteristic circuit, on a basis of frequency characteristics of the second loop filter circuit.

4. The Cartesian feedback circuit according to claim 1, comprising a signal compensating circuit to compensate for the harmonic signal generated by the quadrature modulator, so as to increase linearity of the amplifier and eliminate hysteresis of the amplifier, and to output the compensated harmonic signal to the amplifier, the signal compensating circuit being provided between the quadrature modulator and the amplifier.

5. The Cartesian feedback circuit according to claim 4, wherein the signal compensating circuit is a diode linearizer to compensate for the harmonic signal generated by the quadrature modulator.

6. The Cartesian feedback circuit according to claim 1, comprising:

a first signal compensating circuit to compensate for the first digital I signal so as to increase linearity of the Cartesian feedback circuit; and a second signal compensating circuit to compensate for the first digital Q signal so as to increase the linearity of the Cartesian feedback circuit.

7. The Cartesian feedback circuit according to claim 1, comprising:

a first signal compensating circuit to compensate for the first digital I signal based on a second digital I signal, so as to increase linearity of the Cartesian feedback circuit; and a second signal compensating circuit to compensate for the first digital Q signal based on a second digital Q signal, so as to increase the linearity of the Cartesian feedback circuit.

8. The Cartesian feedback circuit according to claim 7, wherein the first signal compensating circuit compensates for the first digital I signal based on the second digital I signal, so as to increase the linearity of the Cartesian feedback circuit and eliminate hysteresis of the Cartesian feedback circuit, and the second signal compensating circuit compensates for the first digital Q signal based on the second digital Q signal, so as to increase the linearity of the Cartesian feedback circuit and eliminate the hysteresis of the Cartesian feedback circuit.

9. The Cartesian feedback circuit according to claim 1, comprising:

in addition to the quadrature demodulator, a second quadrature demodulator to demodulate each of the second I signal and the second Q signal from the harmonic signal amplified by the amplifier;

a first signal compensating circuit to compensate for the first digital I signal based on a second digital I signal, so as to increase linearity of the Cartesian feedback circuit; and a second signal compensating circuit to compensate for the first digital Q signal based on a second digital Q signal, so as to increase the linearity of the Cartesian feedback circuit.

10. The Cartesian feedback circuit according to claim 9, wherein the first signal compensating circuit compensates for the first digital I signal based on the second digital I signal, so as to increase the linearity of the Cartesian feedback circuit and eliminate hysteresis of the Cartesian feedback circuit, and the second signal compensating circuit compensates for the first digital Q signal based on the second digital Q signal, so as to increase the linearity of the Cartesian feedback circuit and eliminate the hysteresis of the Cartesian feedback circuit.

\* \* \* \* \*